United States Patent
Parry et al.

(10) Patent No.: US 6,215,435 B1
(45) Date of Patent: Apr. 10, 2001

(54) LINEAR CURRENT SENSING CIRCUIT FOR MOTOR CONTROLLER

(75) Inventors: John Parry, Hermosa Beach; David C. Tam; Christopher C. Chey, both of Redondo Beach; Ajit Dubhashi, El Segundo; Toshio Takahashi, Rancho Palos Verdes; Aristide Tchamdsou, Los Angeles, all of CA (US)

(73) Assignee: International Rectifier Corporation, El Segundo, CA (US)

( * ) Notice: Subject to any disclaimer, the term of this patent is extended or adjusted under 35 U.S.C. 154(b) by 0 days.

(21) Appl. No.: 09/266,822

(22) Filed: Mar. 12, 1999

Related U.S. Application Data

(60) Provisional application No. 60/077,904, filed on Mar. 13, 1998.

(51) Int. Cl.[7] .................................................. H03M 1/60
(52) U.S. Cl. ........................................ 341/157; 318/811
(58) Field of Search .................................. 341/157, 155; 318/811, 599, 700

(56) References Cited

U.S. PATENT DOCUMENTS

| | | | |
|---|---|---|---|
| 3,806,787 | 4/1974 | Erler | 318/599 |
| 4,435,697 | * 3/1984 | Takahashi | 341/157 |
| 4,710,748 | * 12/1987 | Champavier | 341/157 |
| 4,812,848 | * 3/1989 | Fry | 341/157 |
| 5,892,391 | * 4/1999 | Hughes | 327/438 |

* cited by examiner

Primary Examiner—Peguy JeanPierre
(74) Attorney, Agent, or Firm—Ostrolenk, Faber, Gerb & Soffen, LLP

(57) ABSTRACT

A circuit for recovering a signal of interest which is offset by a common mode displacement, such is the case when the signal is the voltage across a current sense resistor located on the high side bus or between the switches of a motor controller circuit. The circuit of the present invention converts the voltage across the resistor into a pulse code modulated data, then downshifts the voltage, and then recovers the signal of interest at the lower voltage by demodulating the signal. The recovered signal is then processed, either with a synchronized sample and hold circuit to provide an analog output, or with a counter and latch to provide a digital output.

12 Claims, 8 Drawing Sheets

LINEAR CURRENT SENSING CIRCUIT FOR MOTOR CONTROLLER

This application claims the benefit of U.S. Provisional Application Ser. No. 60/077,904, filed Mar. 13, 1998.

BACKGROUND OF THE INVENTION

1. Field of the Invention

The present invention relates to a circuit for recovering a signal of interest which is offset by a common mode displacement and, more specifically, to a circuit for converting an analog current sense signal in a motor drive controller circuit from a high side reference potential to a low side reference potential for measurement and processing.

2. Description of the Related Art

In many applications, an analog signal of interest may be inherently offset by a common mode potential between the signal itself and a circuit intended to condition, measure or process that signal in some way. Such is the case, for example, in a motor controller circuit, where current to the motor is to be sensed via a resistor disposed on the high side of the circuit.

Referring first to FIG. 1, a typical three-phase motor controller circuit 2 is shown, in which a motor controller IC 4, such as the IR2130 IC (by International Rectifier, the assignee of the present application), produces gate signals to appropriately control the switching of six power MOSFETs or IGBTs 6, 8, 12, 14, 16, 18 arranged in a respective half-bridge circuits for driving the three respective phase inputs 20, 22, 24 to the three-phase motor 26.

The current delivered to the motor can be measured by a resistor 28 on the low side in the return path, as shown in FIG. 1.

However, a current sense resistor located on the low side bus such as shown in FIG. 1 will not detect faults in which current flows only through the upper side IGBTs or MOSFETs, such as a ground fault at the output of the converter or an inadvertent external connection of a short-circuit from an ac output terminal to the motor frame. To detect these types of faults, or to measure current flow into the motor for closed loop or open loop motor control, a current sense resistor can be located either on the high side bus, as shown in FIG. 2 by reference numeral 30, or in the path between the power switching node and the motor, as shown by reference numeral 32 in FIG. 2.

A significant problem associated with sensing current with a resistor at either of the locations shown in FIG. 2, however, is that the voltage level at the current sense resistor is at a high voltage potential. However, the circuitry responsible for conditioning and processing this signal is often referenced to a static node, commonly a signal ground shared with a MOS gate driver IC, such as the IR 2130, which operates at a relatively low potential. This results in a relatively large "common mode displacement"; i.e., a relatively large voltage difference between the high side voltage and the low side measurement circuitry. The common mode displacement must be removed or "rejected", so as to recover only the signal of interest with minimal distortion to the signal.

Various techniques utilizing full or partial electrical isolation of unwanted common mode influence are well known, for example, opto-isolation or magnetic coupling of the signal to the measurement circuit. The protocol for accomplishing this transfer of information may be analog or digital in nature; however, such methods often embrace drawbacks including cost, complexity, size and various types of distortion to the wanted signal. Where electrical isolation between signal source and destination references is not possible or not desirable, the following considerations would typically apply.

An ideal case for recovering the signal of interest exists where the signal either is large, or can be made large, when compared to the common mode displacement, and such displacement remains static, or is relatively free from noise or other disturbances. In such a case, several established techniques, such as direct analog subtraction of the common mode displacement, or utilization of a differential amplifier stage, may be employed. Typically, such methods may be realized using inexpensive operational amplifier circuits.

In some cases, however, the signal of interest may be small when compared to the common mode displacement between the signal reference point and the measurement reference point. In such cases, the signal may suffer distortion from a number of sources. As an example of one such source, if a differential amplifier is used to remove the common mode potential, distortion will result from limitations in common mode rejection performance of the amplifier. To an extent, such distortion may be countered by amplification of the signal at source and subsequent scaling at the measurement reference point; however, reduction in distortion may still be insufficient to render this method entirely practical.

In other cases, the common mode displacement may be time variable or subject to noise originating from various sources. For example, in a power switching application, noise resulting from fast transients in the system are often difficult to contain and typically couple to the common mode potential. In power circuits, the common mode displacement is often time variable and may be high in both frequency and slew rate. In these cases, the signal of interest may prove difficult to entirely separate from the common mode potential. Again, distortion of the recovered signal may arise from a number of sources. For example, if a differential amplifier is used, inherent bandwidth limitations may impede complete rejection of the common mode signal, resulting in "contamination" of the signal.

Accordingly, it would be desirable to provide an improved circuit for recovering a signal of interest which is small compared to the common mode displacement between the signal reference point and the measurement reference point, and, more specifically, to provide such a circuit for sensing current flowing through a high side resistor in a motor controller.

SUMMARY OF THE INVENTION

The present invention provides a circuit and method for transferring static or time variable analog information without electrical isolation from a first (source) reference potential to a second (destination) reference potential.

More specifically, the present invention is a circuit for recovering an input signal at a first potential which is offset by a common mode displacement from a second potential, and includes in its most basic form: (1) circuitry for converting the input signal at the first potential to a pulse width modulated signal; and (2) circuitry for level shifting the pulse width modulated signal from the first potential to the second potential.

To limit power consumption, the pulse width modulated signal at the first potential is preferably converted into a current pulse train prior to level shifting from the first potential to the second potential. The level shifted pulse train signal is then converted into a pulse width modulated signal at the second potential using a pulse filter and an R-S latch.

To convert the input signal to a pulse width modulated signal, the present invention employs an A/D converter using pulse width modulated encoding techniques formed of a waveform generator for generating a triangular or sawtooth signal at a carrier frequency, and a comparator for determining whether the input signal is greater than or less than the triangular or sawtooth signal.

A counter/latch circuit connected to an output of the R-S latch is preferably used to generate a digital output signal at the second potential which is representative of the input signal. Alternatively, to generate an analog output signal, a first low pass filter is connected to the R-S latch, a sample-and-hold circuit is connected to the first low pass filter (the sample-and-hold circuit being synchronized to the carrier frequency), and a second low pass filter connected to the output of the sample-and-hold circuit.

The circuit of the present invention can advantageously be used in a motor controller for transferring information relating to current flow through a high side resistor from a high voltage potential to a lower level potential for conditioning and processing the information.

Other features and advantages of the present invention will become apparent from the following description of the invention which refers to the accompanying drawings.

DETAILED DESCRIPTION OF THE PREFERRED EMBODIMENTS

Figure 2:
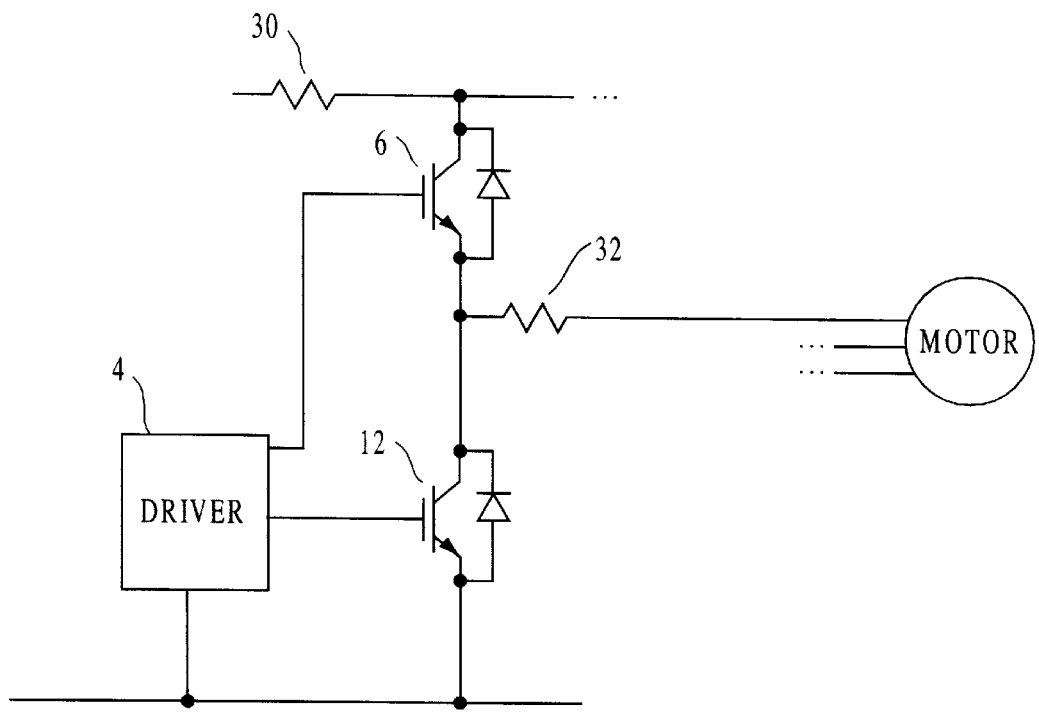
FIG. 2 shows one leg of a prior art motor controller circuit with a current sense resistor provided either on the high side bus or between the switches.
Figure 3:
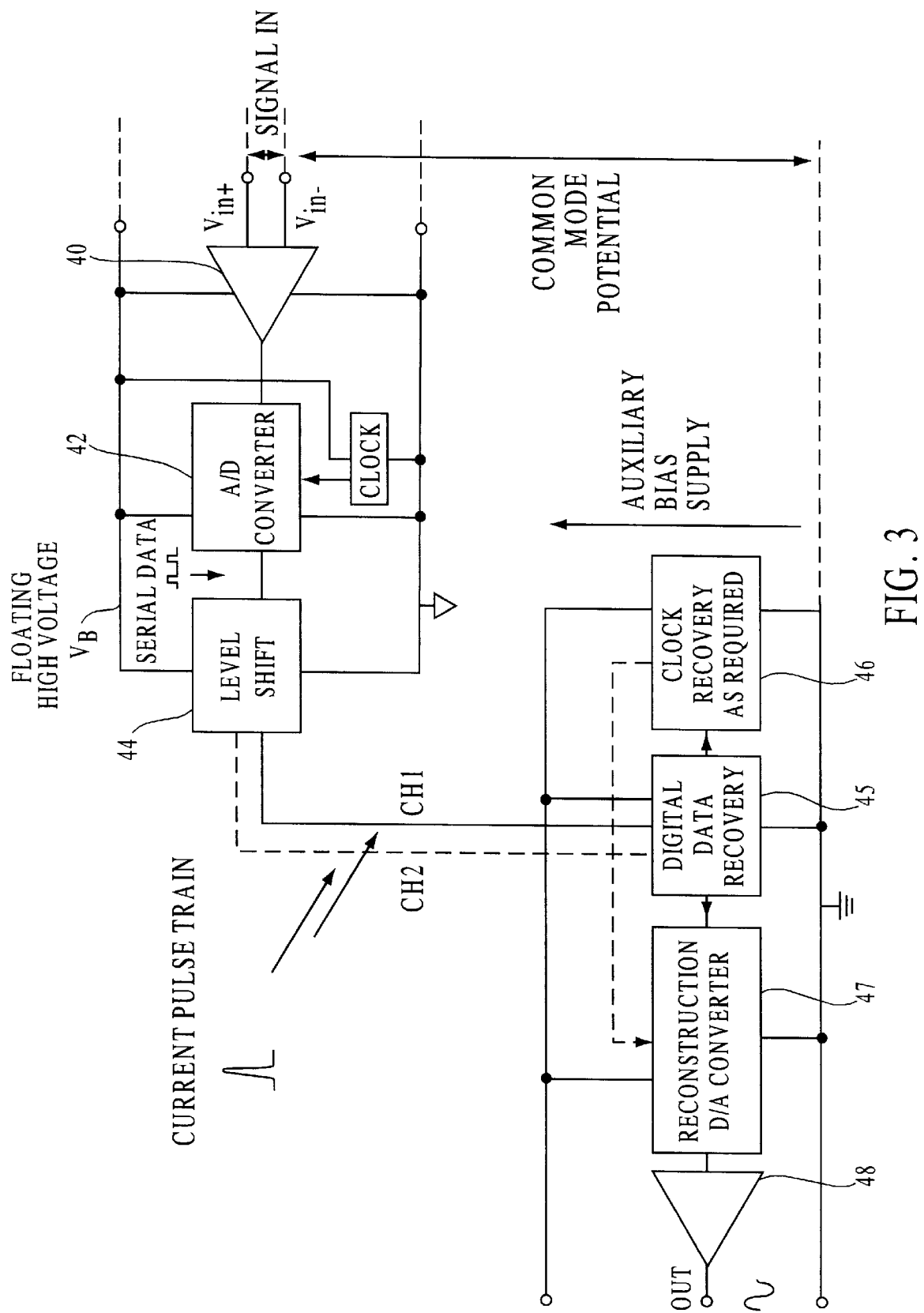
FIG. 3 is a block diagram depicting a generalized block diagram of the circuit of the present invention.

Referring now to FIG. 3, a simplified block diagram of the circuit of the present invention is shown. The "signal in" on the right side of the block diagram may be the voltage across resistor 32 of the motor control circuit of FIG. 2, which is a floating high level signal.

After the analog signal of interest is buffered, amplified and/or processed (block 40), it is translated into digital form (e.g., a serial pulse width modulated signal) via an analog-to-digital (A/D) converter 42. The digitized data at a floating high voltage potential is then converted to a current pulse train and downshifted to a low level reference potential by level shift circuit 44. The pulse code modulated data (still in digital form) is then recovered at the new lower reference potential in block 46 and re-synchronized (as required) in block 48. The analog signal of interest is then reconstructed by demodulating the digital signal in digital-to-analog (D/A) converter 47. Finally, scaling, offset adjustments and other necessary processing is performed in block 48 to restore and present the signal of interest to external circuitry. As shown in FIG. 3, level shift circuit 44 may have one or more channels.

Figure 1:
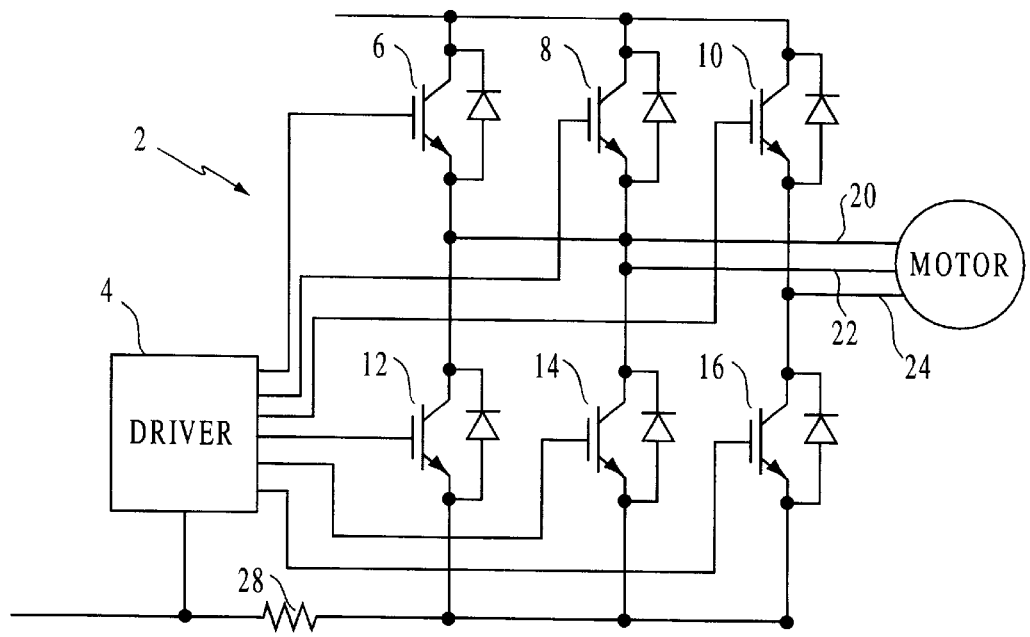
FIG. 1 shows a prior art three-phase motor controller circuit provided with a current sense resistor in the return path.
Figure 4:
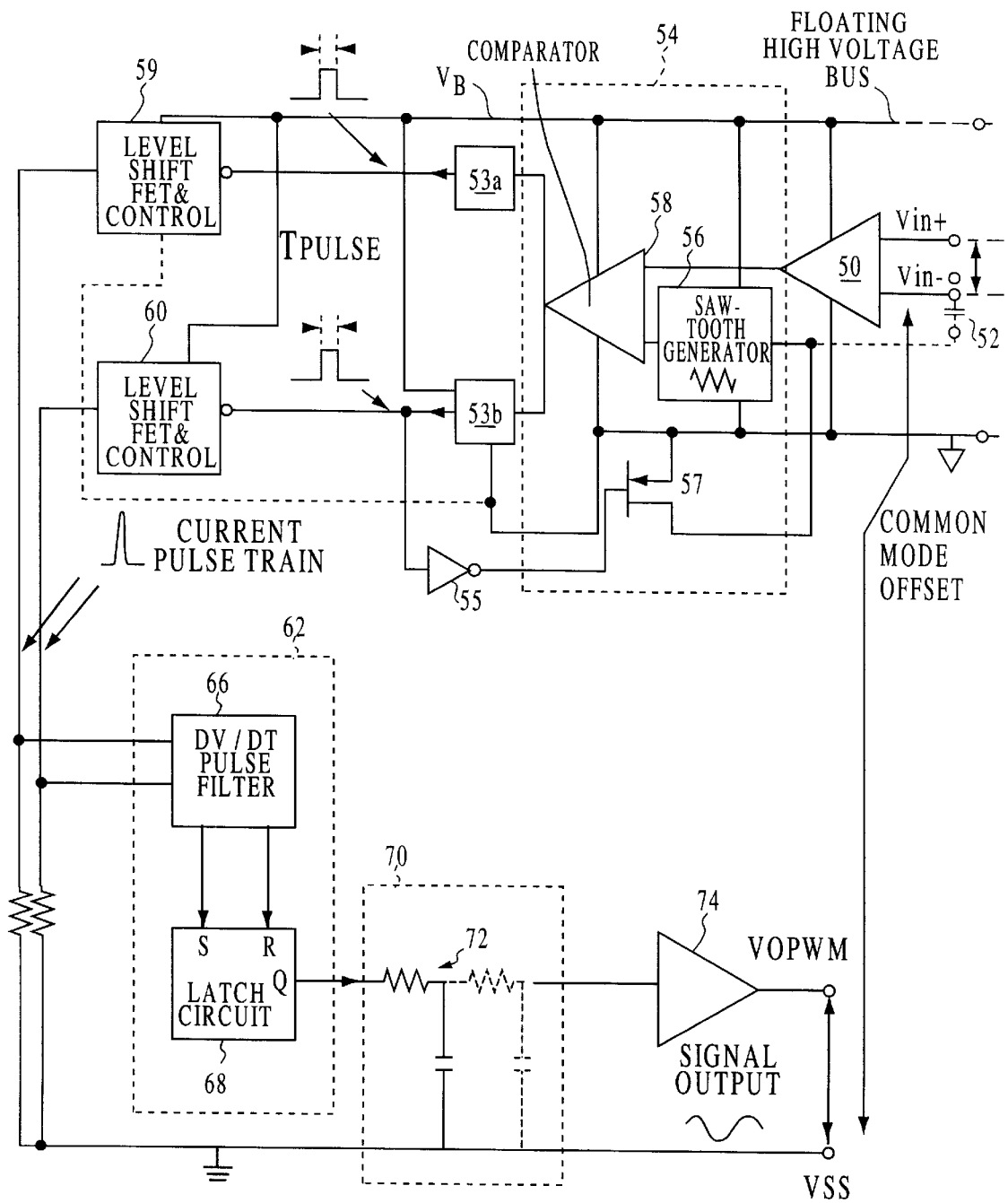
FIG. 4 is a block diagram depicting a more detailed block diagram of the preferred embodiment of the present invention.

FIG. 4 depicts a more detailed block diagram showing a preferred embodiment of the present invention. As in the circuit of FIG. 1, the signal of interest is first input to a differential amplifier 50 for buffering and amplification as necessary. Other offset adjustments may be performed as necessary. Capacitor 52 provides an internal or external timing component as required.

The circuitry shown within block 54 translates the signal from analog to digital form using pulse-width modulation encoding via a sawtooth generator 56 and a comparator 58. In the preferred embodiment of the invention, sawtooth generator 56 outputs a high frequency (e.g., 40 kHz) waveform (the sawtooth generator may, if desired, be replaced with a triangle wave generator). The output of block 54 is a pulse width modulated waveform, in which the width of the pulses represents the voltage $V_{IN}$.

The PWM output from comparator 58 is separated and fed into two pulse generators, 53a and 53b. One of the pulse generators is rising edge triggered and the other is falling edge triggered. The choice as to which generator is which determines the input/output phase.

As shown in FIG. 4, pulse generator 53b may also function as a driver for a reset transistor 57 in pulse-width modulation encoding circuit 54, requiring an inverter 55 if transistor 57 is an N-channel type transistor as shown.

After being converted to pulses in pulse generators 53a and 53b, the digital PWM information is transported to a lower reference potential. This is accomplished by using corresponding level shift FET and control circuits 59 and 60. A single level shift circuit for synchronous transmission of PWM data may be appropriate in applications where the common mode potential is sufficiently low to tolerate power dissipation, further reducing cost. On the other hand, when two level shift circuits are used, power dissipation is reduced, since only short duration conduction phases are needed to convey the necessary PWM edge events.

Next, recovery of the digital PWM data is performed at the lower reference potential in block 62. In the preferred embodiment of the invention shown in FIG. 4, the signal recovery circuit comprises a DV/DT pulse filter 66 and an R-S latch circuit 68.

The signal output from block 62 is then demodulated in block 70 by a low pass filter 72 to remove the PWM carrier and recover the original analog signal information. No complex reconstruction of the signal is necessary, nor recovery of a clock for data synchronization. Only a simple restoration of DC offset is typically desired.

In block 74, scaling, offset adjustments and other processing, buffering, etc., is applied to the signal, as necessary to restore and present the signal of interest to external circuitry in a desirable way.

When the PWM carrier frequency to signal bandwidth ratio is appropriate, the distortion of the signal from carrier frequency variation is minimal and generally inconsequential. Therefore, provided that linearity of the sawtooth or triangle wave generator is maintained, the frequency tolerance of the generator may be relaxed, leading to a cost reduction and allowing on-chip integration of the generator without significantly adverse signal distortion at the output.

Figure 5A:
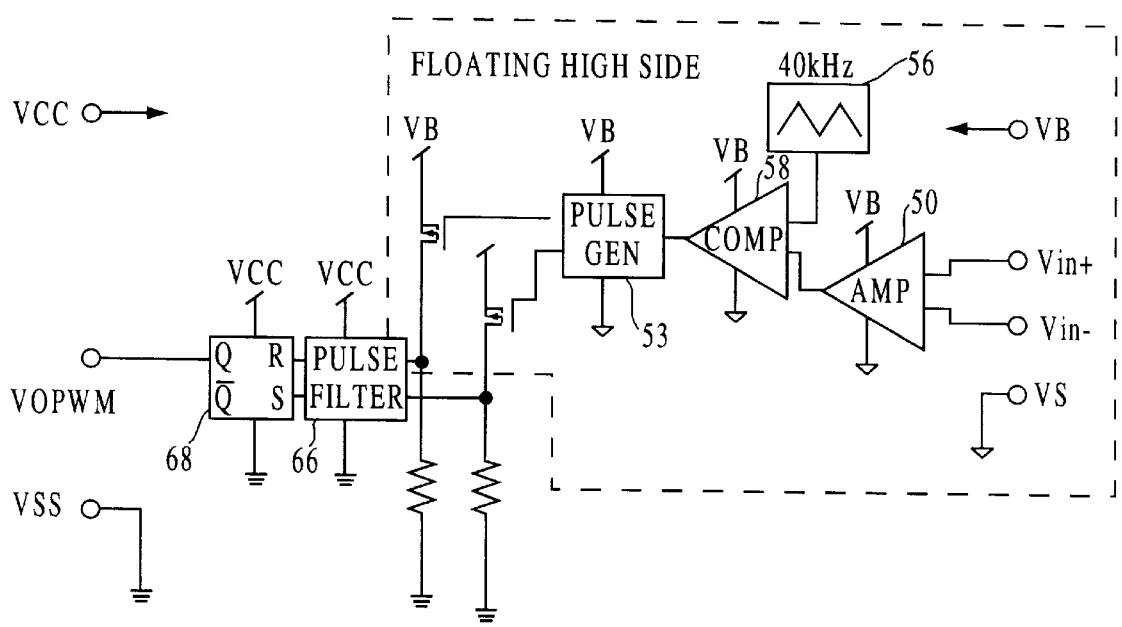
FIG. 5A is a simplified block diagram of the present invention.
Figure 6:
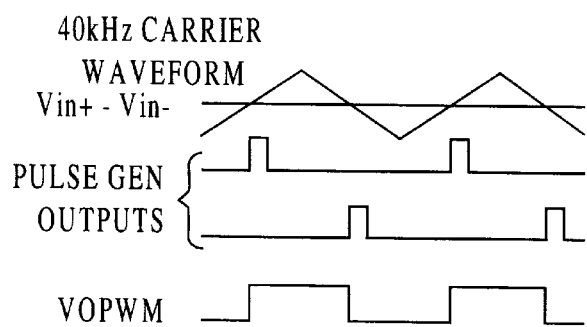
FIG. 6 is a timing diagram for the current sense circuit of the present invention.
Figure 5B:
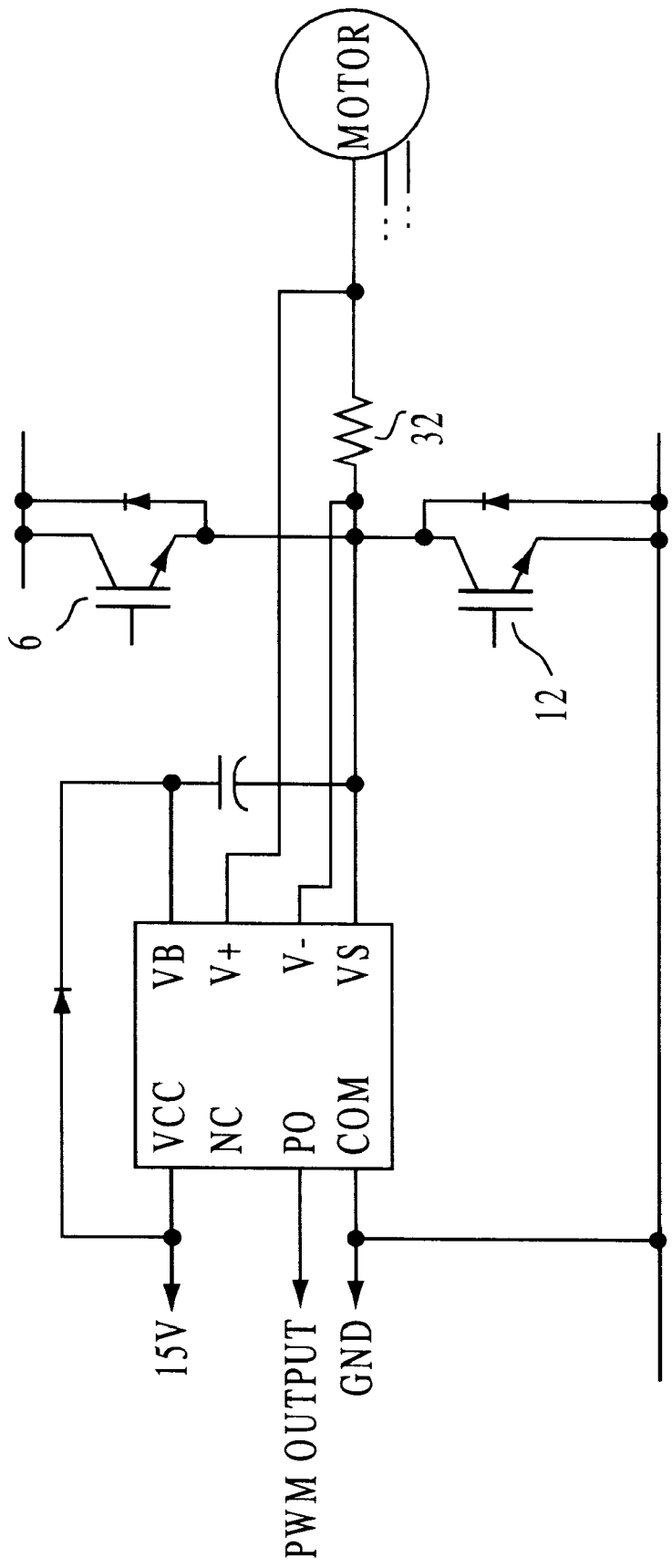
FIG. 5B shows the pin outs of the present invention as provided in a monolithic IC, together with a typical connection diagram for the IC for sensing current in a motor controller.
Figure 7A:
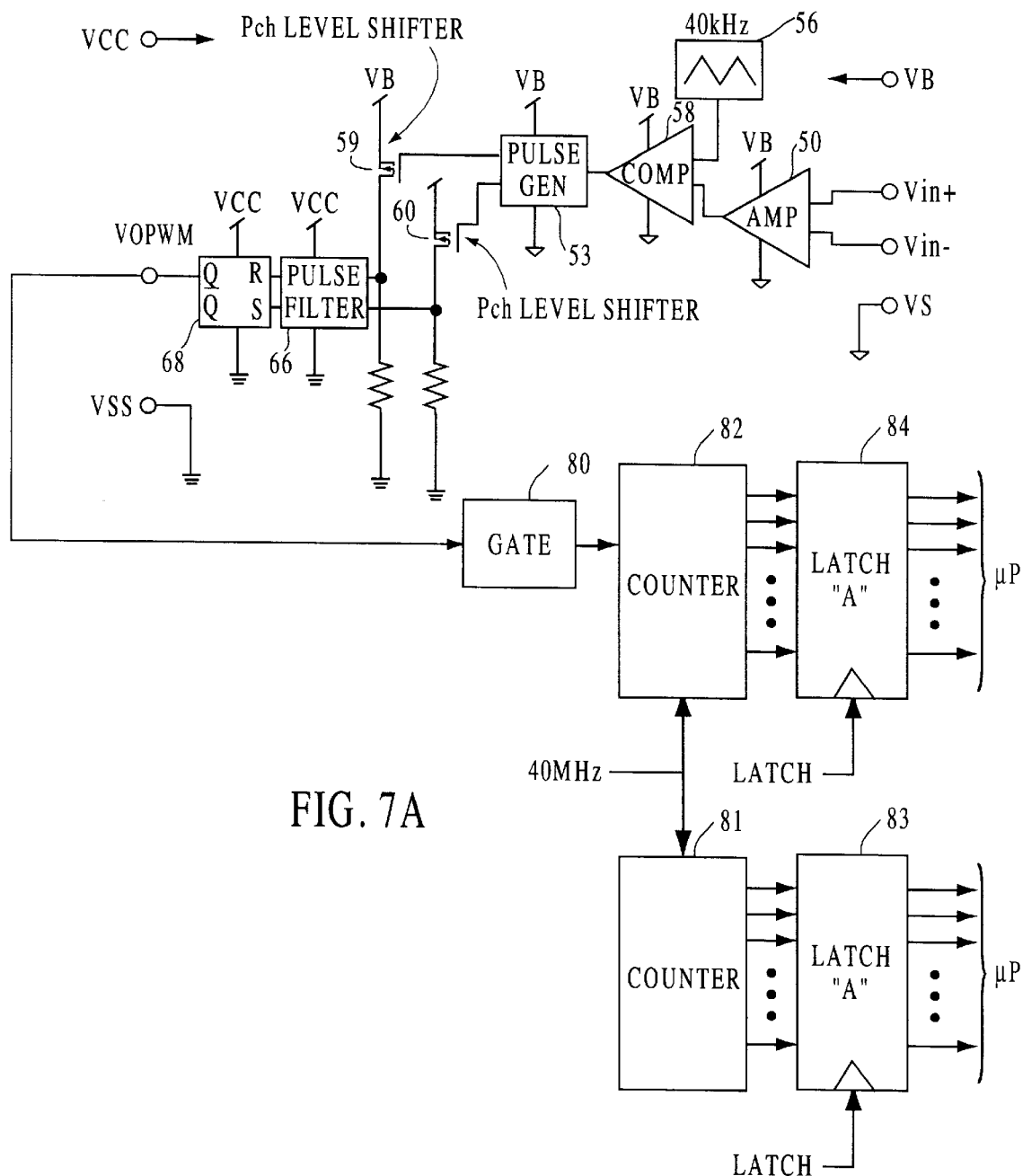
FIG. 7A is a block diagram of the preferred circuitry for converting the PWM output signal of the present invention into a digital output for direct connection to a microprocessor.

In the preferred embodiment of the invention, all of the functional construction blocks described above are integrated onto a single, monolithic chip to provide a linear current sensing IC for motor drive applications, as shown in the block diagrams of FIG. 5A and 5B. The output format of the IC shown in FIG. 5B is discrete PWM at 40 kHz, which eliminates the need for an A/D interface. A timing diagram for the circuit of the present invention is shown in FIG. 6. The pin-outs for the eight-pin linear current sensing IC shown in FIG. 5B, are as follows:

VCC Low side and logic supply voltage
COM Low side logic ground
VIN+ Positive sense input
VIN− Negative sense input
VB High side supply
Vs High side return
PO Digital PWM output
NC No connection The digital PWM output signal of the circuit of the present invention can be directly interfaced to a microprocessor with a simple counter and latch circuit shown in FIG. 7A. More specifically, the digital PWM output signal is applied to gate 80 and then directed to a digital counter 82, which counts up upon the occurrence of a rising edge in the PWM output signal, and counts down upon the occurrence of a falling edge in the PWM output signal. The digital output of counter 82 is applied to a latch 84, which in turn captures and stores the output of counter 82 at appropriate intervals and supplies a digital output (for application to a microprocessor) representing the magnitude of the sensed current.

Figure 7B:
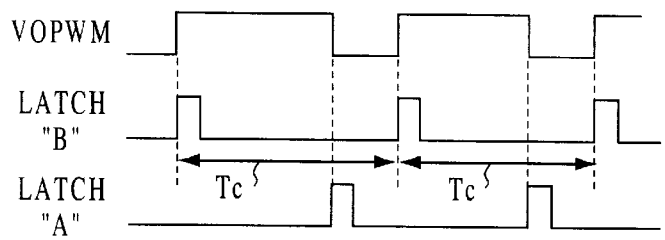
FIG. 7B is a timing diagram for the circuit of FIG. 7A.

Advantageously, variation due to temperature drift can be eliminated with an additional counter and latch circuit, identified in FIG. 7A by reference numerals 81 and 83, respectively. The additional circuitry successfully eliminates temperature drift variations because the PWM period (identified as "Tc" in the waveform diagram of FIG. 7B and extracted through latch 83) changes in the same manner as the PWM pulse width (stored in latch 84) changes with temperature variation. Therefore, by programming the microprocessor to divide the value of latch 84 by the value of latch 83, and using the resulting quotient in place of the value of latch 84, change due to temperature drifted can be eliminated.

Figure 8:
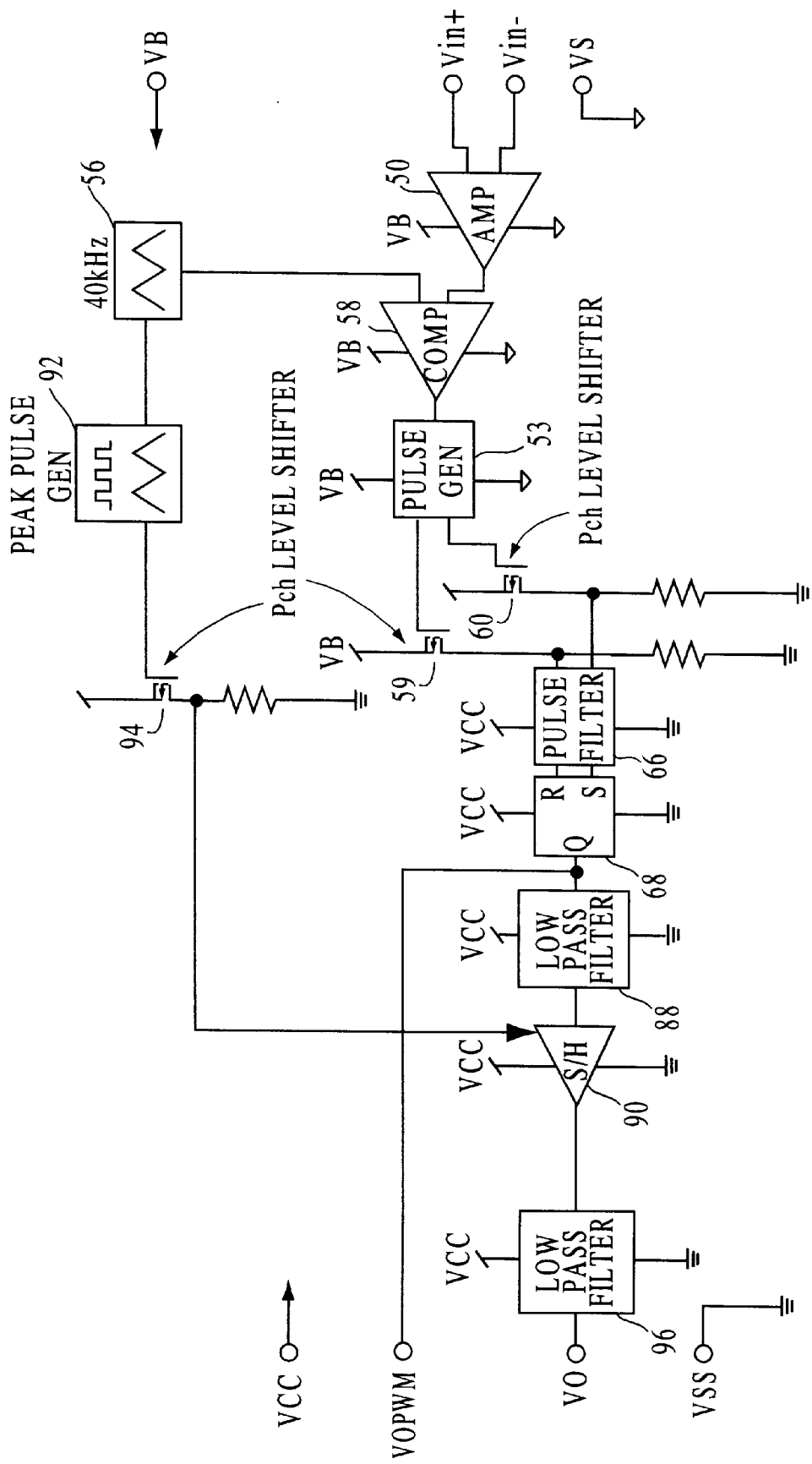
FIG. 8 is a block diagram of the preferred circuitry for converting the PWM output signal of the present invention into an analog output signal.
Figure 9:
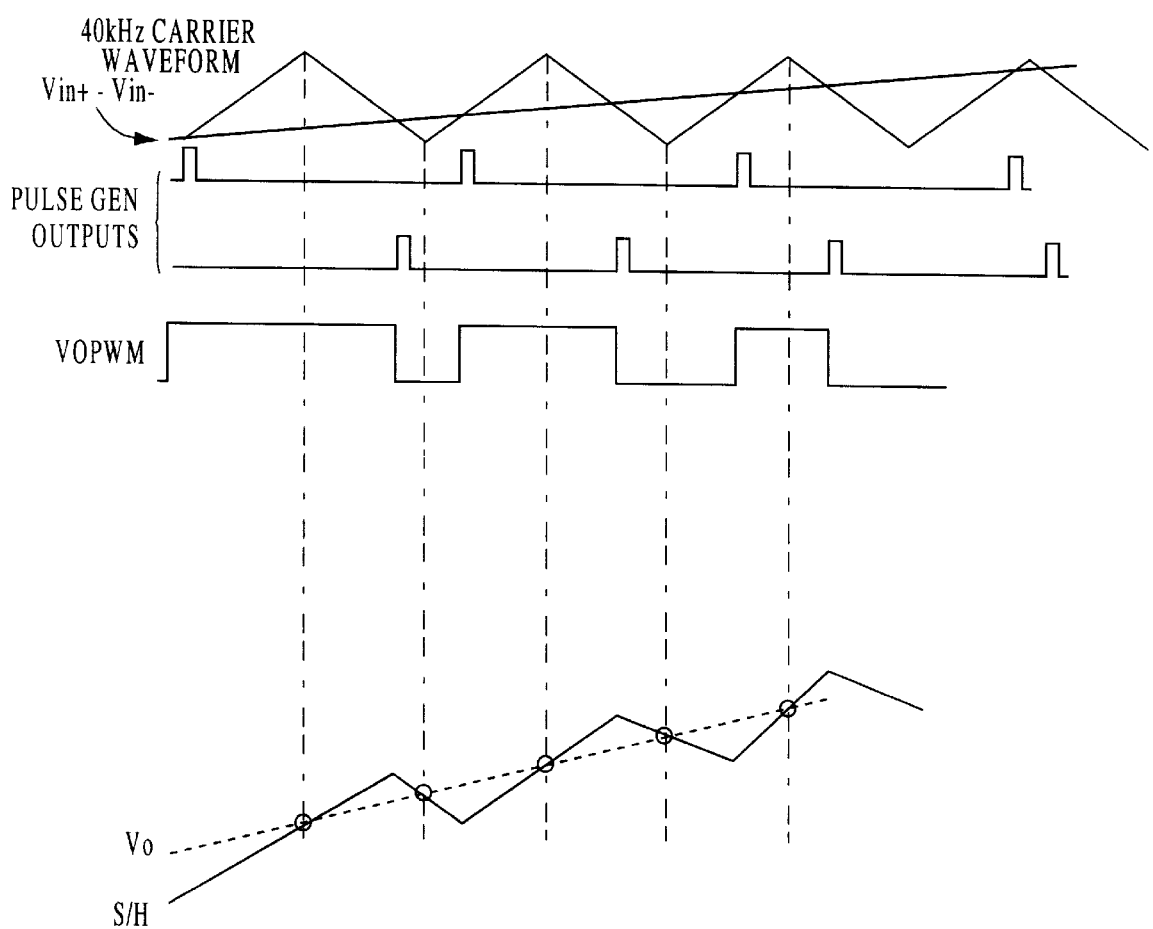
FIG. 9 is a timing diagram for the circuit of FIG. 8.

FIG. 8 shows a circuit for processing the PWM output of the current sense circuit of the present invention to produce an analog output (as opposed to the digital output of FIG. 7A). In this circuit, the PWM output signal is sent to a low pass filter 88 and then to a sample and hold circuit 90, which is oversampled in synchronism with the 40 kHz output of sawtooth or triangular waveform generator 56. More specifically, as shown in FIG. 8, the 40 kHz sawtooth or triangular waveform output is applied to a peak pulse generator 92, which generates a pulse at the positive and negative peaks of the waveform. The resultant pulses are level shifted to a low reference potential by level shift circuit 94, and applied as a clock input to sample and hold circuit 90, resulting in oversampling at the midpoint of the PWM signal as shown in the timing diagram of FIG. 9. The output of sample and hold circuit 90 is then applied to a low pass filter 96 to obtain a smooth analog output signal representative of the signal of interest.

Although the present invention has been described in relation to particular embodiments thereof, many other variations and modifications and other uses will become apparent to those skilled in the art. It is preferred, therefore, that the present invention be limited not by the specific disclosure herein.

What is claimed is:

1. A circuit for recovering an input signal at a first potential which is offset by a common mode displacement from a second potential, said first potential being a relatively high voltage as compared to said second potential, said circuit comprising:

circuitry for converting the input signal at said first potential to a pulse width modulated signal;

circuitry for converting said pulse width modulated signal at said first potential into a current pulse train;

circuitry for level shifting said current pulse train from said first potential to said second potential; and circuitry for converting the level shifted current pulse train into a pulse width modulated signal at said second potential.

2. A circuit as recited in claim 1, wherein said circuitry for converting the input signal at said first potential to a pulse width modulated signal comprises a waveform generator for generating a triangular or sawtooth signal at a carrier frequency and a comparator for determining whether said input signal is greater than or less than said triangular or sawtooth signal.

3. A circuit as recited in claim 1, wherein said circuitry for converting said level shifted pulse train signal into a pulse width modulated signal at said second potential comprises a pulse filter and an R-S latch.

4. A circuit as recited in claim 3, further comprising a counter/latch circuit connected to an output of said R-S latch for generating a digital signal at said second potential which is representative of said input signal.

5. A circuit as recited in claim 3, further comprising a first low pass filter connected to said R-S latch, a sample-and-hold circuit connected to said first low pass filter, said sample-and-hold circuit being synchronized to said carrier frequency, and a second low pass filter connected to the output of said sample-and-hold circuit for generating an analog signal at said second potential which is representative of said input signal.

6. A circuit as recited in claim 1, wherein said input signal comprises the voltage across a current sense resistor in a motor controller circuit.

7. A method for recovering an input signal at a first potential which is offset by a common mode displacement from a second potential, said first potential being at a relatively high voltage as compared to said second potential, said method comprising the steps of:

converting the input signal at said first potential to a pulse width modulated signal;

converting said pulse width modulated signal at said first potential into a current pulse train;

level shifting said current pulse train from said first potential to said second potential; and converting said level shifted pulse train signal into a pulse width modulated signal at said second potential.

8. A method as recited in claim 7, wherein said step of converting the input signal at said first potential to a pulse width modulated signal is performed by generating a triangular or sawtooth signal at a carrier frequency and determining whether said input signal is greater than or less than said triangular or sawtooth signal at discrete time intervals.

9. A method as recited in claim 8, wherein said step of converting said level shifted pulse train signal into said pulse width modulated signal at said second potential is performed using a pulse filter and an R-S latch.

10. A method as recited in claim 9, further comprising the step of generating a digital signal at said second potential which is representative of said input signal using a counter/latch circuit connected to an output of said R-S latch.

11. A method as recited in claim 9, further comprising the step of generating an analog signal at said second potential which is representative of said input signal by filtering an output signal of said R-S latch with a first low pass filter, processing the output of said first low pass filter with a sample-and-hold circuit, said sample-and-hold circuit being synchronized to said carrier frequency, and filtering the output of said sample-and-hold circuit with a second low pass filter.

12. A method as recited in claim 7, wherein said input signal comprises the voltage across a current sense resistor in a motor controller circuit.

* * * * *